United States Patent
Hunt et al.

(12) 
(10) Patent No.: US 6,784,717 B1
(45) Date of Patent: Aug. 31, 2004

(54) INPUT BUFFER SYSTEM USING LOW VOLTAGE TRANSISTORS

(75) Inventors: Jeffery Scott Hunt, Ackerman, MS (US); Scott Anthony Jackson, Starkville, MS (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/229,481

(22) Filed: Aug. 28, 2002

(51) Int. Cl.[7] ................................................ H03K 5/08
(52) U.S. Cl. ..................... 327/318; 327/333; 326/62; 326/80
(58) Field of Search ......................... 327/108–112, 306, 327/309, 318, 319, 333; 326/62–68, 80–92, 56–58; 307/43, 62, 412, 75

(56) References Cited

U.S. PATENT DOCUMENTS

| | | | | |
|---|---|---|---|---|
| 4,277,782 A | * | 7/1981 | Chao ........................... | 340/661 |
| 5,300,832 A | * | 4/1994 | Rogers ......................... | 326/57 |
| 5,333,093 A | * | 7/1994 | Krautschneider et al. ...... | 361/56 |
| 6,069,515 A | * | 5/2000 | Singh .......................... | 327/309 |
| 6,282,146 B1 | * | 8/2001 | Guo et al. ............. | 365/230.06 |

* cited by examiner

*Primary Examiner*—Minh Nguyen
(74) *Attorney, Agent, or Firm*—Law Office of Dale B. Halling, LLC

(57) ABSTRACT

An input buffer system has an input clipping circuit. The input clipping circuit has a high voltage input and uses transistors all being the thin oxide type transistors. A high voltage detect circuit is coupled to the input clipping circuit. An input buffer circuit is coupled to the input clipping circuit and has a low voltage output range.

6 Claims, 4 Drawing Sheets

US 6,784,717 B1

INPUT BUFFER SYSTEM USING LOW VOLTAGE TRANSISTORS

FIELD OF THE INVENTION

The present invention relates generally to the field of semiconductors and more particularly to an input buffer system.

BACKGROUND OF THE INVENTION

Semiconductor processing techniques are constantly improving and as they improve the required power supply voltages are reduced. The best semiconductor processing techniques today only require power supply voltages of around 1.8 volts. These processing techniques create transistors commonly referred to as thin oxide transistors. Thin oxide transistors are faster than the relatively thicker oxide transistors and can be used to produce denser circuits. Unfortunately, thin oxide circuits commonly have to interface with older technology circuits that have relatively high voltage power supplies (e.g., 2.5V, 3.0V or 3.3V). These relatively high voltage circuits contain the transistors commonly referred to as thick oxide transistors. When it is necessary that a signal be transmitted from a high voltage thick oxide circuit to a low voltage, thin oxide circuit, a buffer circuit is required to convert the signal from a high voltage to a lower voltage. Prior art solutions use a buffer circuit that has both thick oxide transistors (components) and thin oxide transistors (components). As a result, the processing of these circuits is relatively complex and expensive. Creating a buffer circuit with transistors that are all the thin oxide type is difficult since the gate oxide voltage stress limit of the thin oxide transistors is lower than the high voltages being applied from an external source. Another problem is creating an input buffer circuit with thin oxide transistors that does not consume current when the input is not transitioning.

Thus there exists a need for an input buffer system that overcomes the problems of the prior art circuits.

SUMMARY OF INVENTION

An input buffer system that overcomes these and other problems has an input clipping circuit. The input clipping circuit has a high voltage input and uses only thin oxide transistors. A high voltage detect circuit is coupled to the input clipping circuit. An input buffer circuit is coupled to the input clipping circuit and has a low voltage output. In one embodiment, the input buffer circuit is formed with transistors having only thin oxide. In another embodiment, the input clipping circuit has a gate bias circuit. In one embodiment, the gate bias circuit is coupled to a gate of a pass transistor.

In one embodiment, the input clipping circuit does not draw any supply current when the high voltage supply is within a normal operating range. In another embodiment, the input buffer circuit does not draw any supply current when it is in a standby mode.

In one embodiment, an input clipping circuit has a pass transistor with a drain coupled to an input signal. A gate bias circuit is coupled to a gate of the pass transistor. A high voltage detect circuit is coupled to the gate bias circuit. In one embodiment, the gate bias circuit has transistors that are only thin oxide transistors. In another embodiment, the input signal is a high voltage signal.

In one embodiment, the gate bias circuit includes a load element coupled to a high voltage power supply and a first controllable switch coupled between the load element and the gate of the pass transistor. In another embodiment, the gate bias circuit has a p-channel transistor with a gate coupled to the source of the pass transistor and has a drain coupled through a second controllable switch to a ground.

In one embodiment, the gate bias circuit has a bias input. In another embodiment, the bias input is coupled to the gate of the pass transistor through a controllable bias switch.

In one embodiment, a buffer circuit has a raised ground inverter coupled to an input. A low level restoring circuit is coupled to the raised ground inverter. A standard inverter is coupled to the low level restoring circuit. In one embodiment, the raised ground inverter includes a load element coupled to a ground. In another embodiment, the raised ground inverter includes transistors that are only thin oxide transistors.

In one embodiment, the low level restoring circuit has a pull down transistor with a gate coupled to the input and a source coupled to a ground. The drain of the pull down transistor is coupled to the standard inverter. In another embodiment, the low level restoring circuit has a n-channel transistor with a gate coupled to an output of the raised ground inverter and a drain coupled to a low voltage power supply. In another embodiment, the low level restoring circuit has a p-channel transistor coupled between the n-channel transistor and the standard inverter. In one embodiment, the n-channel transistor is a low threshold device.

DETAILED DESCRIPTION OF THE DRAWINGS

Figure 1:
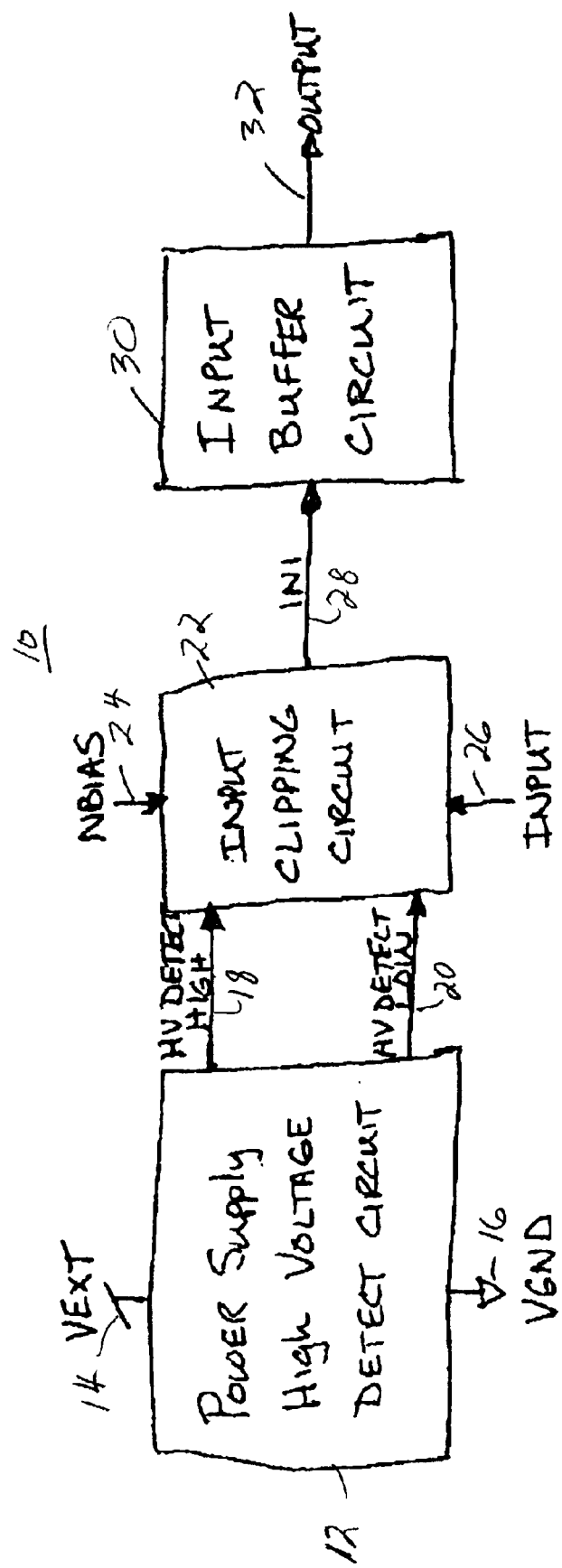
FIG. 1 is a block diagram of an input buffer system in accordance with one embodiment of the invention.

FIG. 1 is a block diagram of an input buffer system 10 in accordance with one embodiment of the invention. The input buffer system 10 has a power supply high voltage detect circuit 12. The high voltage detect circuit 12 is coupled to a external voltage or high voltage power supply 14 and to ground 16. The external voltage 14 may have a nominal voltage 2.5V, 3.0V or 3.3V. The outputs of the high voltage detect circuit 12 are high voltage detect high 18 and high voltage detect low 20. An input clipping circuit 22 is coupled to the signals 18, 20. The input clipping circuit 22 also is coupled to an NBIAS signal 24 and to the input signal 26. The output 28 of the input clipping circuit 22 is coupled to the input buffer circuit 30. The input buffer circuit 30 has an output 32 that has a nominal voltage range of about 0.0–1.8 volts. The input clipping circuit 22 clips the voltage of the input signal 26 and the buffer circuit 30 provides an optimum trip point for the signal. In one embodiment, the input clipping circuit 22 is formed using transistors that are only thin oxide type despite having a high voltage input 26. The input buffer circuit 30 is formed with transistors of the thin oxide type, in one embodiment. The high voltage detect circuit 12 is a standard high voltage detect circuit and may be formed using a comparator.

The input clipping circuit 22 has two modes. A standard operating mode may be defined by VEXT 14 being within a normal operating range. Note that VEXT 14 is the high voltage power supply. A protection mode which is defined by VEXT 14 having a voltage greater than the normal operating range. In the protection mode the high voltage detect high signal 18 is low and the high voltage detect low signal 20 is high. In the normal operating mode the high voltage detect high signal 18 is high and the high voltage detect low signal 20 is low.

Figure 2:
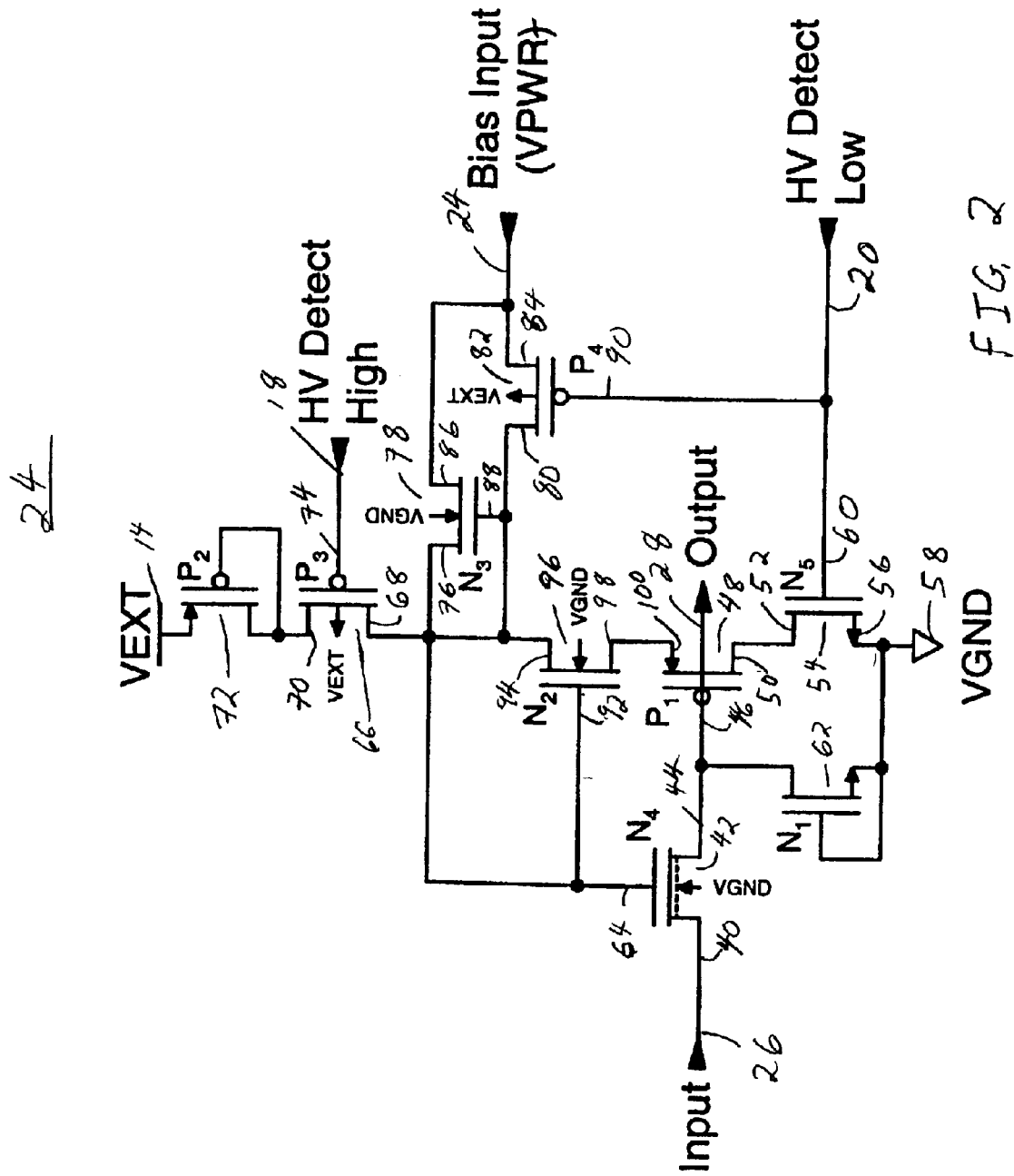
FIG. 2 is a circuit diagram of an input clipping circuit in accordance with one embodiment of the invention.

FIG. 2 is a circuit diagram of an input clipping circuit 22 in accordance with one embodiment of the invention. The input 26 is coupled to a drain 40 of pass transistor 42. In one embodiment, the pass transitor. (N4) 42 is a native device. This provides for a very low threshold device. The dashed line denotes that the device is a native device, however a native device is not required for the invention. The body of the transistor 42 is coupled to ground in one embodiment. The source 44 of pass transistor 42 is coupled to the output 28 and to the gate 46 of the p-channel transistor (P1) 48. The drain 50 of transistor 48 is coupled to the drain 52 of the n-channel transistor (N5) 54. The source 56 of transistor 54 is coupled to ground 58. The gate 60 of transistor 54, also known as the second controllable switch, is coupled to the high voltage detect low signal 20. The source 44 of pass transistor 42 is also coupled to a load element (N1) 62. In this case the load element 62 is shown as a grounded gate transistor that provides a subthreshold leakage current.

The gate 64 of the pass transistor 42 is coupled to a first controllable switch 66. The first controllable switch 66 includes a p-channel transistor having its drain 68 coupled to the gate 64 of pass transistor 42. The source 70 of transistor 66 is coupled to the high voltage power supply 14 through a load element 72. The load element is a diode coupled transistor in one embodiment. The gate 74 of transistor 66 is coupled to the high voltage detect high signal 18. Note that the body of transistor 66 is coupled to the high voltage power supply (VEXT) 14 in one embodiment.

The gate 64 of the pass transistor 42 is also coupled to the source 76 of n-channel transistor (N3) 78 and to the drain 80 of p-channel transistor (P4) 82. The transistor 82 is also called a controllable bias switch. The source 84 of transistor 82 and the drain 86 of transistor 78 are coupled to the bias input 24. In one embodiment, the bias input 24 has a voltage equal to the low voltage power supply (VPWR or VINT). The gate 88 of transistor 78 is also coupled to gate 64 of the pass transistor 42. The gate 90 of transistor 82 is coupled to the high voltage detect low signal 20. The gate 64 of the pass transistor 42 is also connected to the gate 92 and drain 94 of n-channel transistor (N2) 96. The source 98 of transistor 96 is coupled to the source 100 of transistor 48. In one embodiment, the bodies of transistors 78 and 96 are coupled to ground and the body of transistor 82 is coupled to the high voltage power supply VEXT.

The input clipping circuit has two main components the pass transistor 42 and the gate bias circuit that is coupled to the gate of the pass transistor. The gate bias circuit is formed by transistors 48, 54, 66, 72, 78, 82 & 96. The gate bias circuit varies the voltage on the gate 64 of transistor 42 when VEXT exceeds the normal operating range.

In the standard operating mode, the high voltage detect high signal 18 is equal to VEXT 14 and the high voltage detect low signal 20 is equal to VGND 58. As a result, the transistor 66 is off, the transistor 54 is off and the transistor 82 is on. Since transistor 82 is on the gate 64 of the pass transistor 42 is equal to the bias input 24. The output 28 is equal to the signal on the source 44 of the pass transistor 42. Transistor 48 has no appreciable effect on the output 28 since the gate 64 of pass transistor 42 is clamped to the bias input 24 by transistor 82. Essentially, the clipping circuit 24 operates just like a pass transistor in the standard operating mode. As a result, the clipping circuit does not draw any supply current when it is in the standard operating mode.

In the protection mode, the gate bias circuit varies the voltage of the gate 64 of the pass transistor 42 so that the gate oxide based voltage tolerant limit of the pass transistor is not exceeded. In the protection mode, the high voltage detect high signal 18 is low and the high voltage detect low signal 20 is high. As a result transistor 66 is on which couples the gate 64 of the pass transistor 42 to VEXT 14. The transistor 54 is also on since the high voltage detect low signal 20 is high and the transistor 82 is off. This results in the drain 50 of the transistor 48 being coupled to ground. When the input signal 26 is high or approximately VEXT then the source 44 of pass transistor 42 is also high and turns off transistor 48. As a result, the voltage on the gate 64 of the pass transistor 42 starts to pull up to about VEXT less a Vtp (p-channel threshold). However, the voltage on the gate 64 is limited by the transistor 78 to a Vtn (n-channel threshold) above the bias input 24. When the input signal 26 is low (VGND) the transistor 48 turns on coupling the source 100 of transistor 48 to ground. As a result, the voltage on the gate 64 of the pass transistor 42 starts to fall. When the voltage drops too low then transistor 96 starts to turn off stabilizing the voltage on the gate 64 of the pass transistor 42. Thus the gate 64 of the pass transistor 42 is protected from an over voltage situation by dynamically controlling the voltage on the gate 64 of the pass transistor 42 depending on the voltage of the input signal 26. Note that all the transistors in the clipping circuit 24 are thin oxide transistors. The clipping circuit 24 does draw supply current in the protection mode.

Figure 3:
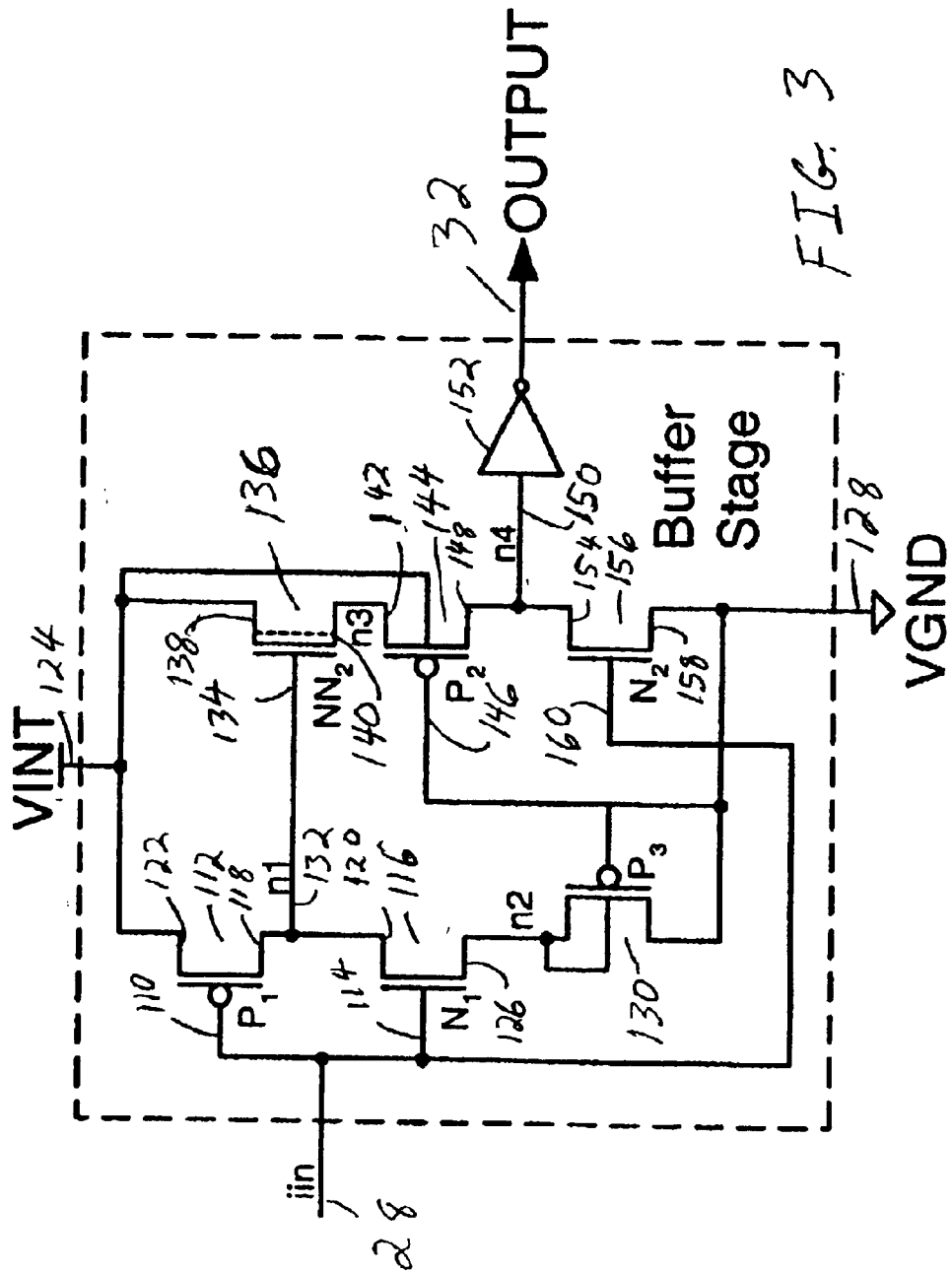
FIG. 3 is a circuit diagram of a buffer circuit in accordance with one embodiment of the invention.

FIG. 3 is a circuit diagram of a buffer circuit 30 in accordance with one embodiment of the invention. The buffer circuit 30 has an input 28 that may be coupled to the output of the input clipping circuit. The input 28 is coupled to the gate 110 of p-channel transistor (P1) 112 and to the gate 114 of n-channel channel transistor (N1) 116. The drain 118 of transistor 112 is coupled to the drain 120 of transistor 116. The source 122 of the transistor 112 is coupled to the internal power supply or low voltage power supply VINT 124. As will be apparent to those skilled in the art, this is a standard inverter configuration. However, the source 126 of transistor 116 is coupled to ground 128 through a load element 130. The load element 130 is a diode coupled transistor (P3) but may be any load element. The load element 130 effectively raises the ground level of the inverter composed of transistors 112 and 116. As a result, the transistors 112 and 116 and the load element 130 form a raised ground inverter. The output of the raised ground inverter (n1) 132 is coupled to the gate 134 of the n-channel transistor (NN2) 136. Note that the dashed line in the transistor 136 indicates that the transistor may be a native transistor, which provides a low threshold device. The drain 138 of transistor 136 is coupled to the low voltage power supply 124. The source 140 of transistor 136 is coupled to the source 142 of p-channel transistor (P2) 144. The gate 146 of the transistor 144 is coupled to ground 128. The drain 148 of the transistor 144 is coupled to the input 150 of a standard inverter 152 and to the drain 154 of the n-channel transistor (N2) 156. Note that the body of transistor 144 is connected to the low voltage power supply in one embodiment. The source 158 of transistor 156 is coupled to ground 128. The gate 160 of transistor 156 is coupled to the input 28. The transistors 136, 144, & 156 form a low level restoring circuit.

Figure 4:
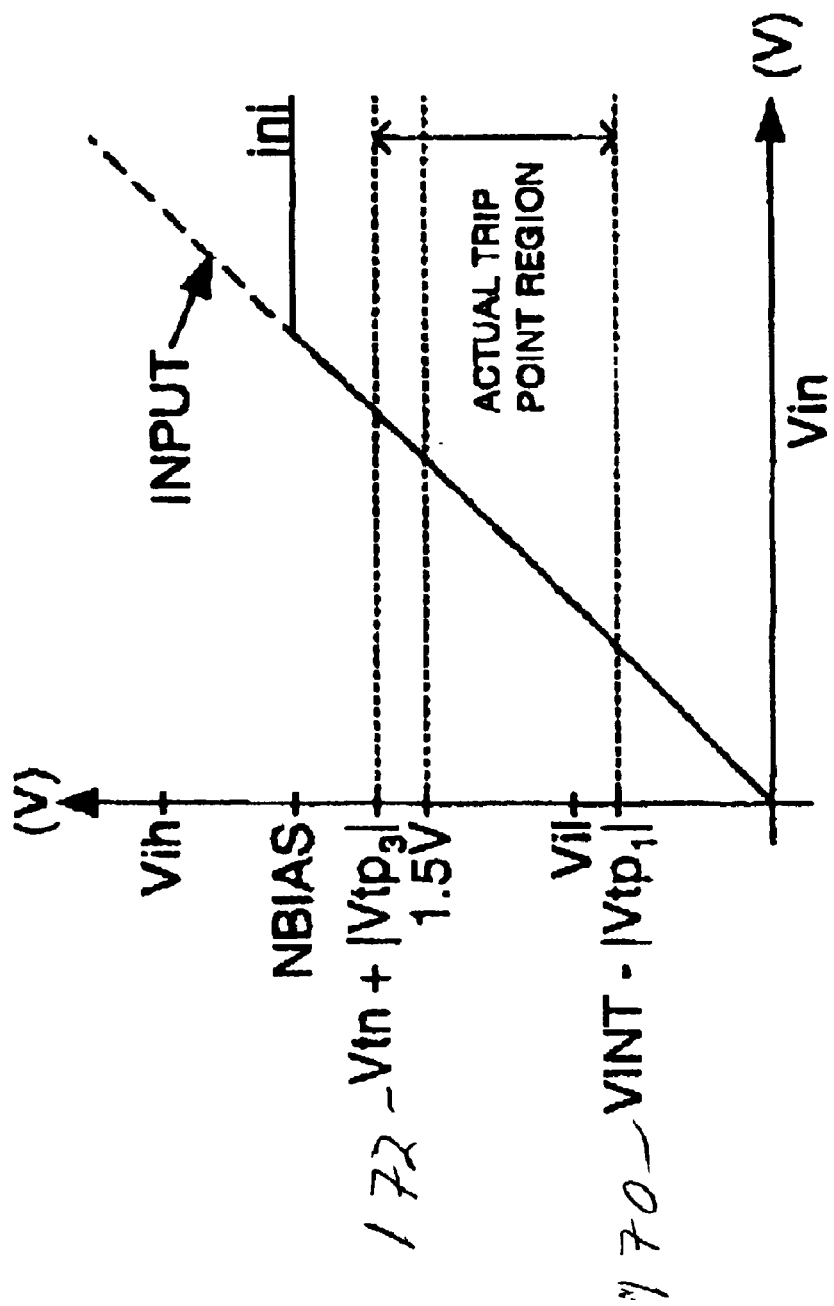
FIG. 4 is a graph of the operation of the buffer circuit of in accordance with one embodiment of the invention.

The raised ground inverter (112, 116, 130) shifts the trip point of the inverter to a higher level. FIG. 4 is a graph of the operation of the buffer circuit in accordance with one embodiment of the invention. FIG. 4 shows the trip point region as between VINT−|Vtp1| and Vtn+|Vtp3|. The lower level 170 is when the transistor 112 enters strong inversion and the upper level 172 is when the transistor 116 enters strong inversion. Thus these levels 170 and 172 define a trip point region. As a result the trip point occurs when both transistors 112 and 116 are in weak inversion. The output 132 of the raised ground inverter results in the low level not being ground but Vtn+|Vtp3| (threshold of load element P). If the output 132 were used to drive the standard inverter 152 it is possible that crowbar current would be consumed in the inverter 152. As a result, the low level restoring circuit has transistor 156 that pulls the input 150 of inverter 152 to VGND when the input signal 28 is high. When the input 28 is high, the output 132 of the raised ground inverter is low (approximately a p-channel threshold above ground). The transistor 136 is a native device and it might still draw current from VINT 124 when the output is low. As a result, the transistor 144 is designed as a high threshold device that prevents transistor 144 from consuming current when the output 132 is low by increasing the source voltage of transistor 144 high enough to turn off the transistor 144. When the input signal 28 is low the gate 134 of transistor 136 is pulled high to VINT. The voltage at the source 142 of the transistor 144 is high enough to overcome the p-channel threshold turning on transistor 144 and the input 150 of the inverter is pulled high.

Thus there has been described an input buffer system that uses transistors that are all thin oxide type transistors and does not draw any supply current when the circuit is in standby mode. Standby mode is when the input to the clipping circuit is within approximately 200 mV, in one embodiment, of either the external power supply or ground and the external power supply is within the normal operating range. This feature is especially important when the circuit is used for portable or battery powered applications. Note that while the invention has been described in connection with integrated circuits it is applicable to any circuit in which a high voltage input signal needs to be converted to a low voltage input signal.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. An input buffer system, comprising:
   an input clipping circuit receiving a high voltage input providing a clipped voltage output and including only transistors of a low voltage type transistors;
   a high voltage detect circuit coupled to the input clipping circuit for detecting whether an external signal is for detecting whether an external signal is outside a predetermined operating range and providing a high voltage high detect output signal and a high voltage low detect output signal to the input clipping circuit; and
   an input buffer circuit receiving the clipped voltage output and providing a low voltage output.

2. The system of claim 1, wherein the input buffer circuit is formed with transistors all being low voltage type transistors.

3. The system of claim 1, wherein the input clipping circuit has a gate bias circuit.

4. The system of claim 3, wherein the gate bias circuit is coupled to a gate of a pass transistor.

5. The system of claim 1, wherein the input clipping circuit does not draw any supply current when the high voltage input is within a nominal operating range.

6. The system of claim 1, wherein the input buffer circuit does not draw any supply current when it is in a standby mode.

* * * * *